United States Patent
Takyu et al.

(10) Patent No.: US 8,790,995 B2
(45) Date of Patent: Jul. 29, 2014

(54) PROCESSING METHOD AND PROCESSING DEVICE OF SEMICONDUCTOR WAFER, AND SEMICONDUCTOR WAFER

(75) Inventors: Shinya Takyu, Saitama-ken (JP); Noriko Shimizu, Yokohama (JP); Tsutomu Fujita, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 83 days.

(21) Appl. No.: 13/422,470

(22) Filed: Mar. 16, 2012

(65) Prior Publication Data

US 2013/0001766 A1    Jan. 3, 2013

(30) Foreign Application Priority Data

Jun. 30, 2011    (JP) .................................. 2011-146049

(51) Int. Cl.
*H01L 21/301* (2006.01)

(52) U.S. Cl.
USPC .................................. 438/462; 257/E21.238

(58) Field of Classification Search
USPC .................... 438/465; 257/E21.238, E21.484
See application file for complete search history.

(56) References Cited

U.S. PATENT DOCUMENTS

| | | | |
|---|---|---|---|
| 6,162,702 A | 12/2000 | Morcom et al. | |
| 7,559,826 B2 | 7/2009 | Sekiya | |
| 7,705,430 B2 | 4/2010 | Sekiya | |
| 2009/0036034 A1 | 2/2009 | Sekiya | |
| 2009/0186563 A1* | 7/2009 | Takahashi et al. | 451/57 |
| 2010/0059862 A1* | 3/2010 | Seddon | 257/618 |

FOREIGN PATENT DOCUMENTS

| | | |
|---|---|---|
| JP | 2007-19461 | 1/2007 |
| JP | 2007-35756 | 2/2007 |
| JP | 2010-283185 | 12/2010 |

\* cited by examiner

*Primary Examiner* — Chandra Chaudhari
(74) *Attorney, Agent, or Firm* — Oblon, Spivak, McClelland, Maier & Neustadt, L.L.P.

(57) ABSTRACT

According to one embodiment, a substrate processing method is disclosed. The above method includes: grinding an outer edge portion on a back surface of a semiconductor wafer with a semiconductor element formed on its front surface with a first grindstone or blade to thereby form an annular groove; grinding a projecting portion on an inner side of the groove with a second grindstone to thereby form a recessed portion integrally with the groove on the back surface of the semiconductor wafer; and grinding a bottom surface of the recessed portion including a ground surface made by the second grindstone with a third grindstone.

14 Claims, 4 Drawing Sheets

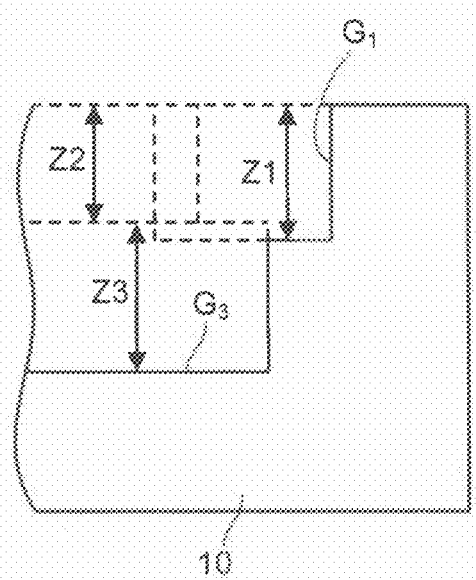

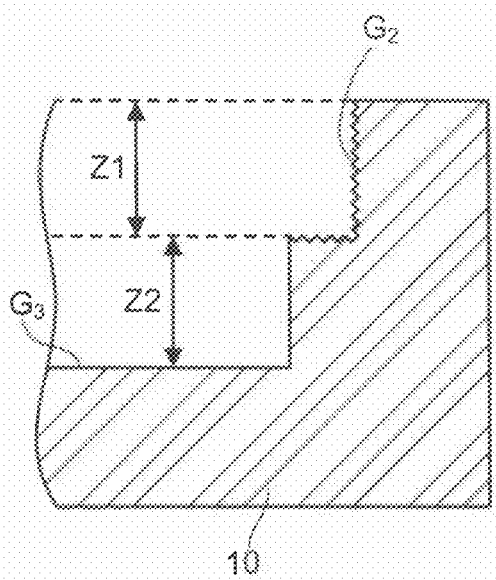

PROCESSING METHOD AND PROCESSING DEVICE OF SEMICONDUCTOR WAFER, AND SEMICONDUCTOR WAFER

CROSS-REFERENCE TO RELATED APPLICATION

This application is based upon and claims the benefit of priority from the prior Japanese Patent Application No. 2011-146049, filed on Jun. 30, 2011; the entire contents of all of which are incorporated herein by reference.

FIELD

Embodiments described herein relate generally to a processing method and a processing device of a semiconductor wafer, and a semiconductor wafer.

BACKGROUND

As a method of thinning a semiconductor wafer, there has been known a method called the TAIKO process which leaves an ring of a few millimeters in width on the outer edge of the wafer and grinds only the inner area of the back surface of the wafer. According to the above method, the semiconductor wafer has the outer peripheral portion that is not ground to remain with its original thickness, so that mechanical strength of the wafer is maintained, and it is possible to suppress cracking or warpage of the semiconductor wafer at the time of the semiconductor wafer being processed or transferred thereafter.

In the TAIKO process, when grinding the inner area, normally, for increasing an index, rough grinding is performed with a grindstone with a coarse grain size, and next finish grinding is performed with a grindstone with a fine grain size. In the above case, in the finish grinding, an inner region is ground rather than a region to be ground in the rough grinding, so that a rough ground surface remains around the outer periphery of the finish ground region. As a result, the semiconductor wafer has a problem that cracking easily occurs starting from the above rough ground surface. Such ease of occurrence of cracking is significant as the thickness of the semiconductor wafer becomes thinner.

BRIEF DESCRIPTION OF THE DRAWINGS

FIG. 2 is a schematic cross-sectional view for explaining the processing method of the semiconductor wafer according to the embodiment.

FIG. 4 is a schematic cross-sectional view for explaining the processing method of the semiconductor wafer shown in FIG. 3A to FIG. 3C in contrast with FIG. 2.

DETAILED DESCRIPTION

In general, according to one embodiment, a processing method of a semiconductor wafer is disclosed. The method includes: grinding an outer edge portion on a back surface of a semiconductor wafer with a semiconductor element formed on its front surface with a first grindstone or blade to thereby form an annular groove; grinding a projecting portion on an inner side of the groove with a second grindstone to thereby form a recessed portion integrally with the groove on the back surface of the semiconductor wafer; and grinding a bottom surface of the recessed portion including a ground surface made by the second grindstone with a third grindstone.

According to another embodiment, a processing device of a semiconductor wafer is disclosed. The device includes: a first grindstone or blade with which an outer edge portion on a back surface of a semiconductor wafer with a semiconductor element formed on its front surface is ground to thereby form an annular groove; a second grindstone with which a projecting portion on an inner side of the groove formed by the first grindstone or blade is ground to thereby form a recessed portion integrally with the annular groove on the back surface of the semiconductor wafer; and a third grindstone with which a bottom surface of the recessed portion is ground.

According to another embodiment, a semiconductor wafer is disclosed. The semiconductor wafer includes a wafer body; a semiconductor element provided on a front surface of the wafer body; and a recessed portion provided on a back surface of the wafer body. The recessed portion includes a large-diameter portion and a small-diameter portion positioned on a bottom side thereof. The large-diameter portion has a first side surface and a first bottom surface with surface roughness (Ry) of 0.1 μm to 2.5 μm, and the small-diameter portion has a second side surface and a second bottom surface with surface roughness (Ry) of 0.5 μm or more.

Hereinafter, embodiments will be explained with reference to the drawings.

FIG. 1A to FIG. 1D are schematic cross-sectional views showing a processing method of a semiconductor wafer of an embodiment in order of steps.

Figure 1A:
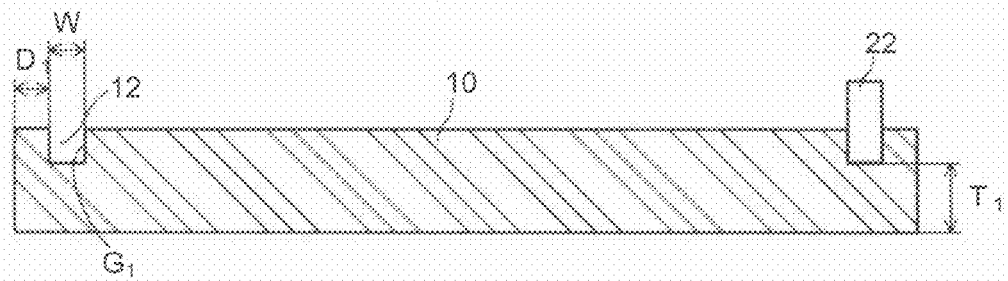
FIG. 1A to FIG. 1D are schematic cross-sectional views each showing a processing method of a semiconductor wafer according to an embodiment.

In this embodiment, as a first grinding step, an outer edge portion on a back surface of a semiconductor wafer (body) 10 that has a semiconductor element formed on its front surface and is made of silicon and the like is ground to thereby form an annular groove 12 (FIG. 1A).

When forming the annular groove 12, there is used a blade 22 provided with, between a second grindstone and a third grindstone to be used in later-described two grinding steps, a grindstone (first grindstone) with a finer grain size than that of a grindstone (the second grindstone) used in at least the initial grinding step (second grinding step), which is, for example, a grindstone making surface roughness (Ry: maximum height) of a ground surface $G_1$ fall within a range of 0.1 μm to 2.5 μm, preferably within a range of 0.1 μm to 2.0 μm. Though the blade 22 provided with the first grindstone is used in the embodiment, a blade without a grindstone may be used if a desired surface roughness (Ry) is obtained. In the embodiment, the annular groove 12 is ground to have the surface roughness (Ry) of 1.0 μm.

The position of the groove 12 formed on the back surface of the semiconductor wafer 10 with the blade 22 is only necessary to be set such that the outer periphery of the groove 12 is positioned outside a semiconductor element forming region on the front surface of the semiconductor wafer 10, and in the case when a notch for indicating a crystal orientation is provided in an outer peripheral portion of the semiconductor wafer 10, the outer periphery of the groove 12 is positioned inside the notch. Normally, a distance $D_1$ from an outer edge of the semiconductor wafer 10 to the outer periphery of the groove 12 falls within a range of 2.0 mm to 5.0 mm. In this embodiment, in the semiconductor wafer of 300 mm in outside diameter and 775 μm in thickness, the groove 12 is provided at the position where the distance $D_1$ becomes 2.1 mm.

Further, the depth and width of the groove 12 vary according to the outside diameter of the semiconductor wafer 10, the thickness of the targeted semiconductor wafer 10 after being ground, or the like, but normally the depth falls within a range where a distance from a bottom surface of the groove 12 to the front surface of the semiconductor wafer, (which will be also called a "remaining amount" hereinafter), $T_1$ becomes 25 μm to 600 μm or so, and a width W is 100 μm to 1.0 mm or so. When the depth is too shallow, a grinding amount by the third grindstone has to be increased in order to thin the semiconductor wafer 10, and thus processing efficiency decreases. Further, when the width is too narrow, technical constraint, (in which, for example, high dimensional accuracy is required in a region to be ground, or the like), in the subsequent processing steps (second grinding step and third grinding step) is increased, and when the width is too wide, it becomes difficult to form the groove 12 having desired surface roughness. In this embodiment, the semiconductor wafer 10 is formed to have the remaining amount $T_1$ of 100 μm and the groove width W of 500 μm in a groove portion.

In the first grinding step, the semiconductor wafer 10 is held with the back surface facing upward on a holding table that holds the semiconductor wafer 10 while the holding table itself rotating, of which illustration is omitted, and while rotating the semiconductor wafer 10 on the holding table, the blade 22 is made to abut on the outer edge portion on the back surface of the semiconductor wafer 10 to form the groove 12. As the holding table, one having a chuck table structure provided with a vacuum chuck on its upper surface is used, for example. The holding table is used also in the later-described second and third grinding steps using the second and third grindstones. When the semiconductor wafer 10 is held on the holding table, a protective member such as a tape is pasted on the front surface of the semiconductor wafer 10 in order to protect the semiconductor element.

Figure 1B:
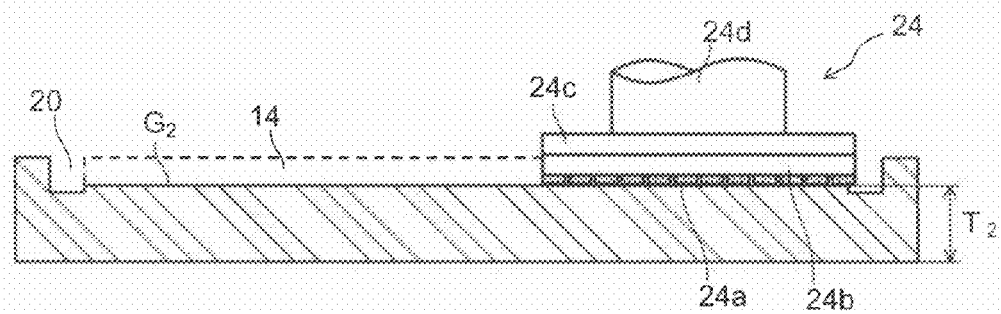

Next, as the second grinding step, a projecting portion 14 on an inner side of the annular groove 12 formed in the first grinding step is ground with a grinding device 24 provided with a second grindstone 24a to form a circular recessed portion 20 including the groove 12 (FIG. 1B).

The above second grinding step is what is called a rough grinding step. Thus, the second grindstone 24a used in the above step is a rough grinding grindstone, and as described above, a grindstone with a coarser grain size than that of the above-described first grindstone, which is, for example, a grindstone such that surface roughness (Ry) of a ground surface $G_2$ becomes 3.0 μm or more, and preferably falls within a range of 3.1 μm to 4.0 μm, is used. In this example, a grindstone making the surface roughness (Ry) of the ground surface $G_2$ become 3.2 μm is used.

The grinding device 24 is structured that a grinding wheel 24b with such a second grindstone 24a firmly fixed to its lower surface and a wheel mount 24c holding the grinding wheel 24b are provided on one end, and a spindle 24d with a motor (not illustrated) attached thereto is provided on the other end, and the spindle 24d rotates by driving of the motor, and with the rotation, the grinding wheel 24b attached to the wheel mount 24c also rotates integrally. Further, the grinding device 24 is also structured that the grinding wheel 24b descends while rotating, and by the descent of the above grinding wheel 24b, the second grindstone 24a firmly fixed to the lower surface of the grinding wheel 24b comes into contact with the back surface of the semiconductor wafer 10 to perform grinding.

In the above second grinding step as well, similarly to the first grinding step, the semiconductor wafer 10 is held with the back surface facing upward on the holding table that holds the semiconductor wafer 10 while the holding table itself rotating, and while rotating the semiconductor wafer 10 on the holding table, the projecting portion 14 is ground. The depth of the grinding is not limited in particular, but when the depth is very shallow, a grinding amount by the subsequent third grindstone has to be increased in order to thin the semiconductor wafer, and thus processing efficiency decreases. Further, when the projecting portion 14 is ground deeper than the groove 12, the rough ground surface made by the second grindstone 24a remains even after grinding by the third grindstone, resulting in that there is a risk that an effect by the present invention cannot be obtained. Thus, in the second processing step, the projecting portion 14 is preferably ground as deep as possible in a range of not exceeding the depth of the groove 12, namely in a range of being equal to or less than the depth of the groove 12. In this embodiment, the semiconductor wafer 10 is formed such that a distance from a bottom surface of the portion ground by the second grindstone 24a to the front surface of the semiconductor wafer, namely a remaining amount $T_2$ in a ground portion by the second grindstone 24a becomes 110 μm.

Figure 1C:
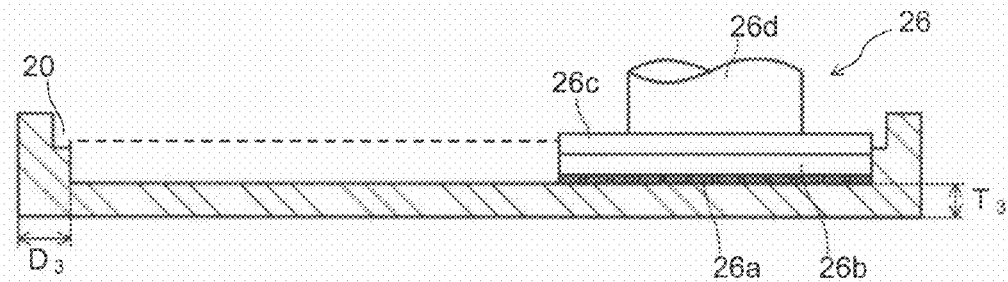

Next, as the third grinding step, the recessed portion 20 formed in the first and second grinding steps is ground deeper with a grinding device 26 provided with a third grindstone 26a until the ground surface $G_2$ made by the second grindstone 24a disappears and the thickness in the recessed portion 20 of the semiconductor wafer 10 becomes a desired thickness (FIG. 1C).

The above third grinding step is what is called a finish grinding step. Thus, the third grindstone 26a used in the above step is a finish grinding grindstone, and a grindstone with a finer grain size than that of the above-described second grindstone 24a, which is, for example, a grindstone such that surface roughness (Ry) of a ground surface $G_3$ becomes 0.5 μM or less, and preferably falls within a range of 0.1 μm to 0.4 μm, is used. In this example, a grindstone making the surface roughness (Ry) of the ground surface $G_3$ become 0.3 μm is used.

The grinding device 26 is structured basically similarly to the grinding device 24 provided with the second grindstone 24a except that the third grindstone 26a is used and the diameter of the outermost circumference on a rotation track of the grindstone 26a is formed larger than that of the grinding device 24. That is, the grinding device 26 is structured that a grinding wheel 26b with the third grindstone 26a firmly fixed to its lower surface and a wheel mount 26c holding the grinding wheel 26b are provided on one end, and a spindle 26d with a motor (not illustrated) attached thereto is provided on the other end, and the spindle 26d rotates by driving of the motor, and with the rotation, the grinding wheel 26b attached to the wheel mount 26c also rotates integrally. Further, the grinding device 26 is also structured that the grinding wheel 26b descends while rotating, and by the descent of the above grinding wheel 26b, the third grindstone 26a firmly fixed to the lower surface of the grinding wheel 26b comes into contact with the bottom surface of the recessed portion 20 to perform grinding.

In the third grinding step as well, similarly to the first and second grinding steps, the semiconductor wafer 10 is held with the back surface facing upward on the holding table that holds the semiconductor wafer 10 while the holding table itself rotating, and while rotating the semiconductor wafer 10 on the holding table, the recessed portion 20 is ground. The grinding is performed until the ground surface $G_2$ made by the second grindstone 24a disappears and the thickness in the recessed portion 20 of the semiconductor wafer 10 becomes a desired thickness as described above, and thereby the depth of the grinding falls within a range where a remaining amount $T_3$ in the recessed portion 20 becomes 20 to 100 μm or so, for example. In this embodiment, the semiconductor wafer 10 is formed such that the remaining amount $T_3$ in the recessed portion 20 becomes 30 μm. Further, in this embodiment, the recessed portion 20 is ground such that a distance $D_3$ from the outer periphery of a ground portion ground in the above third grinding step to the outer edge of the semiconductor wafer 10 becomes 2.6 mm.

Figure 1D:
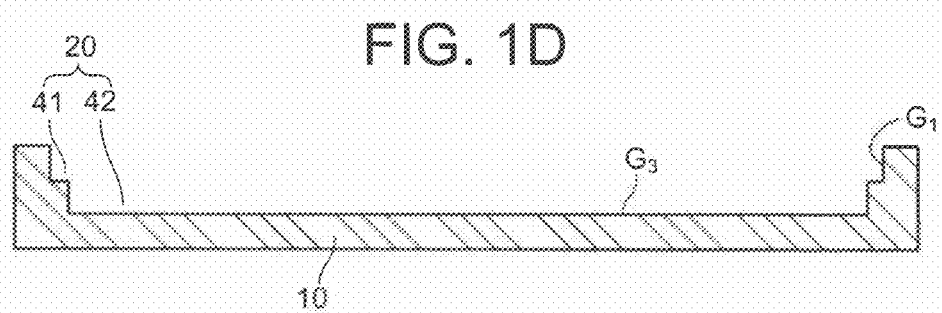

FIG. 1D shows the semiconductor wafer 10 thinned through the above first to third grinding steps, and the semiconductor element (not illustrated) is formed on the front surface and the recessed portion 20 is formed on the back surface. The recessed portion 20 is one formed in a manner that the inner side of the annular groove 12 formed by grinding the outer edge portion on the back surface of the semiconductor wafer 10 with the blade 22 provided with the first grindstone is first ground with the grinding device 24 provided with the second grindstone 24a and is further ground deeper than the groove 12 with the grinding device 26 provided with the third grindstone 26a. Thus, the recessed portion 20 is formed of only the ground surface $G_1$ made by the first grindstone, which is the ground surface with the surface roughness (Ry) of 0.1 μM to 2.5 μM, for example, and the ground surface $G_3$ made by the third grindstone 26a, which is the ground surface with the surface roughness (Ry) of 0.5 μm or less, for example. That is, the recessed portion 20 includes a large-diameter portion 41 that has a first side surface and a first bottom surface, and a small-diameter portion 42 that has a second side surface and a second bottom surface. The first side surface and a first bottom surface of the large-diameter portion 41 are formed of the ground surface $G_1$ made by the first grindstone, which is the ground surface with the surface roughness (Ry) of 0.1 μm to 2.5 μm, for example. The second side surface and a second bottom surface of the small-diameter portion 42 are formed of the ground surface $G_3$ made by the third grindstone 26a, which is the ground surface with the surface roughness (Ry) of 0.5 μm or less, for example. Thus, the thinned semiconductor wafer 10 has an extremely low possibility of being cracked even though the thickness in the recessed portion 20 is thin, and the subsequent handling is facilitated.

FIG. 2 is an enlarged view showing the outer edge portion and the vicinity of the outer edge portion of the semiconductor wafer 10 thinned according to this embodiment, and Z1 to Z3 denote ground portions or ground amounts in the first to third grinding steps respectively.

As explained above, in this embodiment, the outer edge portion on the back surface of the semiconductor wafer is ground with the blade provided with the first grindstone to form the annular groove, and next the projecting portion on the inner side of the annular groove is ground with the second grindstone for rough grinding to form the recessed portion integrated with the groove, and thereafter the bottom surface of the recessed portion is ground with the third grindstone for finish grinding, so that on the back surface of the semiconductor wafer, the recessed portion whose internal surface is made of only the ground surfaces made by the first and third grindstones is formed. Thus, even though the thickness in the recessed portion of the semiconductor wafer is thinned, it is possible to sufficiently suppress cracking of the semiconductor wafer 10, and to facilitate the subsequent handling at the time of the semiconductor wafer 10 being processed or transferred.

Figure 3A:
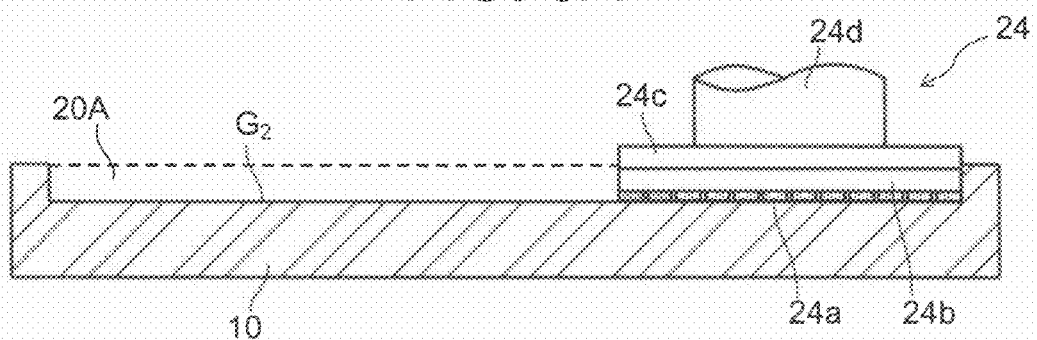
FIG. 3A to FIG. 3C are schematic cross-sectional views each showing a processing method of a semiconductor wafer for comparison with the embodiment.
Figure 3B:
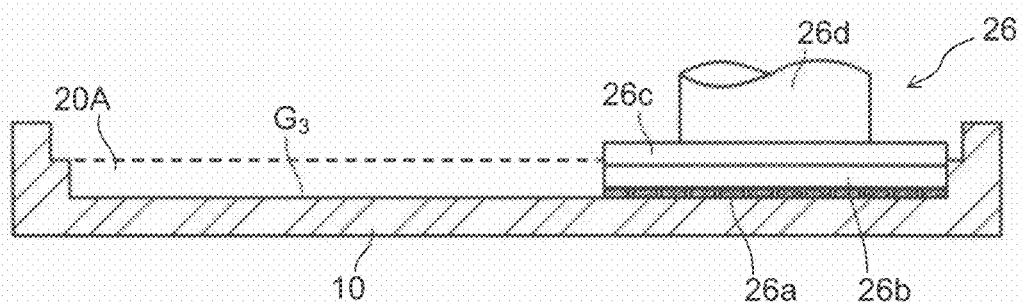
Figure 3C:
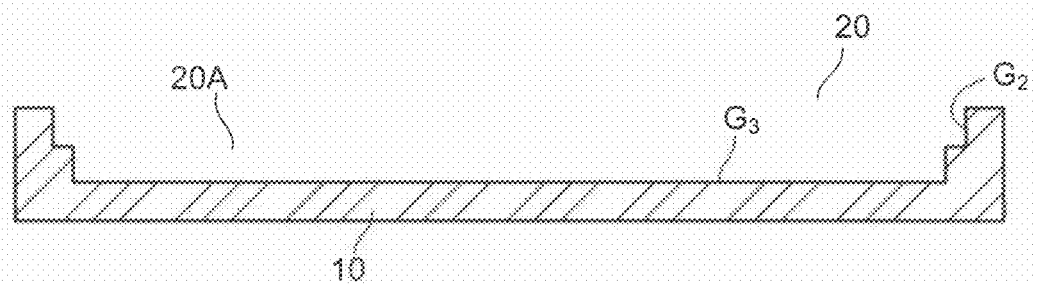

Here, for comparison with this embodiment, there will be described a processing method in the case when a recessed portion is formed on a back surface of a semiconductor wafer only by grinding with a rough grinding grindstone and grinding with a finish grinding grindstone, and a semiconductor wafer obtained by the above processing method. FIG. 3A to FIG. 3C are views showing the above processing method in order of steps. Note that in FIG. 3A to FIG. 3C, the same reference numerals and symbols are given to the same elements or elements having the same functions as those described in FIG. 1A to FIG. 1D, and overlapping explanation thereof will be omitted.

As shown in FIG. 3A to FIG. 3C, in the above method, the back surface of the semiconductor wafer 10 is first ground with the grinding device 24 provided with the second grindstone 24a for rough grinding to form a recessed portion 20A (FIG. 3A). Next, a bottom surface of the recessed portion 20A is ground with the grinding device 26 provided with the third grindstone 26a for finish grinding until the thickness in the recessed portion 20A of the semiconductor wafer 10 becomes a desired thickness (FIG. 3B).

FIG. 3C shows the semiconductor wafer 10 thinned by the above method, and further FIG. 4 is an enlarged view showing an outer edge portion and the vicinity of the outer edge portion of the semiconductor wafer 10. As shown in FIG. 3C, on the back surface of the semiconductor wafer 10, the recessed portion 20A in a shape similar to that of the recessed portion 20 in this embodiment is formed. However, the above recessed portion 20A is one formed in a manner that the back surface of the semiconductor wafer 10 is ground with the grinding device 24 provided with the second grindstone 24a for rough grinding, and next is ground with the grinding device 26 provided with the third grindstone 26a for finish grinding. Thus, an internal surface of a recessed portion 30, as also shown in FIG. 4, is formed of the rough ground surface $G_2$ made by the second grindstone 24a, which is the ground surface with the surface roughness (Ry) of 3.0 μm or more, for example, and the ground surface $G_3$ made by the third grindstone 26a, which is the ground surface with the surface roughness (Ry) of 0.5 μm or less, for example. In the above semiconductor wafer 10, cracking easily occurs starting from the rough ground surface $G_2$ made by the second grindstone 24a.

In contrast to this, in this embodiment, as shown in FIG. 1D and FIG. 2, the rough ground surface does not remain inside the recessed portion 20 on the back surface of the semiconductor wafer 10, so that cracking does not occur quite easily even though the thickness in the recessed portion 20 of the semiconductor wafer 10 is thinned.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A processing method of a semiconductor wafer, comprising:
    grinding an outer edge portion on a back surface of a semiconductor wafer with a semiconductor element formed on its front surface with a first grindstone or blade to thereby form an annular groove;
    grinding a projecting portion on an inner side of the groove with a second grindstone to thereby form a recessed portion integrally with the groove on the back surface of the semiconductor wafer; and grinding a bottom surface of the recessed portion including a ground surface made by the second grindstone with a third grindstone.

2. The processing method of the semiconductor wafer according to claim 1,
wherein a grain size of the second grindstone is coarser than that of the first grindstone or blade and the third grindstone.

3. The processing method of the semiconductor wafer according to claim 1,
wherein surface roughness (Ry) of a ground surface made by the first grindstone or blade is 0.1 μm to 2.5 μm, surface roughness (Ry) of the ground surface made by the second grindstone is equal to or more than 3.0 μm, and surface roughness (Ry) of a ground surface made by the third grindstone is equal to or less than 0.5 μm.

4. The processing method of the semiconductor wafer according to claim 1,
wherein surface roughness (Ry) of a ground surface made by the first grindstone or blade is 0.1 μm to 2.0 μm.

5. The processing method of the semiconductor wafer according to claim 1,
wherein surface roughness (Ry) of the ground surface made by the second grindstone is 3.1 μm to 4.0 μm.

6. The processing method of the semiconductor wafer according to claim 1,
wherein surface roughness (Ry) of a ground surface made by the third grindstone is 0.1 μm to 0.4 μm.

7. The processing method of the semiconductor wafer according to claim 1,
wherein depth of which the projecting portion on the inner side of the groove is ground with the second grindstone is equal to or less than depth of the groove.

8. The processing method of the semiconductor wafer according to claim 1,
wherein the groove is formed such that the outer periphery of the groove is positioned outside a semiconductor element forming region on the front surface of the semiconductor wafer.

9. The processing method of the semiconductor wafer according to claim 1,
wherein a distance ($D_1$) from an outer edge of the semiconductor wafer to the outer periphery of the groove is 2.0 mm to 5.0 mm.

10. The processing method of the semiconductor wafer according to claim 1,
wherein a width (W) of the groove is 100 μm to 1.0 mm.

11. The processing method of the semiconductor wafer according to claim 1,
wherein a remaining amount ($T_1$) by the first grindstone or blade is 25 μm to 600 μm.

12. The processing method of the semiconductor wafer according to claim 1,
wherein at least the ground surface made by the second grindstone is ground by the third grindstone.

13. The processing method of the semiconductor wafer according to claim 1,
wherein a diameter of an outermost circumference on a rotation track of the third grindstone is larger than that of the second grindstone.

14. The processing method of the semiconductor wafer according to claim 1,
wherein a remaining amount ($T_3$) by the third grindstone is 20 μm to 100 μm.

* * * * *